United States Patent
Liao et al.

(10) Patent No.: US 9,406,605 B2
(45) Date of Patent: Aug. 2, 2016

(54) INTEGRATED CIRCUIT WITH GUARD RING

(71) Applicant: TAIWAN SEMICONDUCTOR MANUFACTURING COMPANY, LTD., Hsinchu (TW)

(72) Inventors: Hsien-Yuan Liao, Hsinchu (TW); Shyh-An Chi, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 115 days.

(21) Appl. No.: 14/515,306

(22) Filed: Oct. 15, 2014

(65) Prior Publication Data

US 2015/0364421 A1  Dec. 17, 2015

Related U.S. Application Data

(63) Continuation-in-part of application No. 14/303,206, filed on Jun. 12, 2014.

(51) Int. Cl.
| | | |
|---|---|---|
| H01L 23/528 | (2006.01) | |
| H01L 23/522 | (2006.01) | |
| H01L 23/64 | (2006.01) | |
| H01L 23/00 | (2006.01) | |
| H01L 23/58 | (2006.01) | |
| H01L 49/02 | (2006.01) | |

(52) U.S. Cl.
CPC .......... *H01L 23/5227* (2013.01); *H01L 23/528* (2013.01); *H01L 23/5226* (2013.01); *H01L 23/5286* (2013.01); *H01L 23/564* (2013.01); *H01L 23/585* (2013.01); *H01L 23/645* (2013.01); *H01L 28/10* (2013.01)

(58) Field of Classification Search
CPC ............ H01L 23/5226; H01L 23/5227; H01L 23/564; H01L 23/585; H01L 23/645; H01L 23/5286; H01L 28/10; H01L 2924/19042
USPC .................... 438/381, 210; 257/531, E21.022
See application file for complete search history.

(56) References Cited

U.S. PATENT DOCUMENTS

| | | | | |
|---|---|---|---|---|
| 5,610,569 A * | 3/1997 | Hwang | ............... | H01F 17/0033 336/200 |
| 6,921,959 B2 * | 7/2005 | Watanabe | ........... | H01L 23/5227 257/127 |
| 7,999,386 B2 * | 8/2011 | Uchida | ............... | H01L 23/5227 257/759 |
| 8,791,501 B1 * | 7/2014 | Fuentes | .................. | H01L 28/10 257/154 |
| 2014/0367835 A1 * | 12/2014 | Wei | ........................ | H01L 23/562 257/620 |

* cited by examiner

*Primary Examiner* — Michael Trinh
(74) *Attorney, Agent, or Firm* — Hauptman Ham, LLP

(57) ABSTRACT

An integrated circuit includes a circuit and a guard ring. The circuit is over a substrate. The guard ring surrounds the circuit and includes a staggered line. The staggered line comprises a first zigzag line and a second zigzag line. The first zigzag line comprises interconnections formed in at least two GDS layers. The second zigzag line comprises interconnections formed in at least two GDS layers. The first zigzag line and the second zigzag line form a first quadrangle and a second quadrangle.

20 Claims, 7 Drawing Sheets

INTEGRATED CIRCUIT WITH GUARD RING

PRIORITY CLAIM

The present application is a continuation-in-part of U.S. application Ser. No. 14/303,206, filed Jun. 12, 2014, which is entirely incorporated by reference herein.

BACKGROUND

On-chip inductors are often used in integrated circuits such as radio frequency integrated circuits ("RFIC"). Guard rings are used to isolate the coupling of on-chip inductors to other on-chip inductors, as well as other circuit components. In one direction (1D) metal routing, guard rings are rectangular-shaped.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
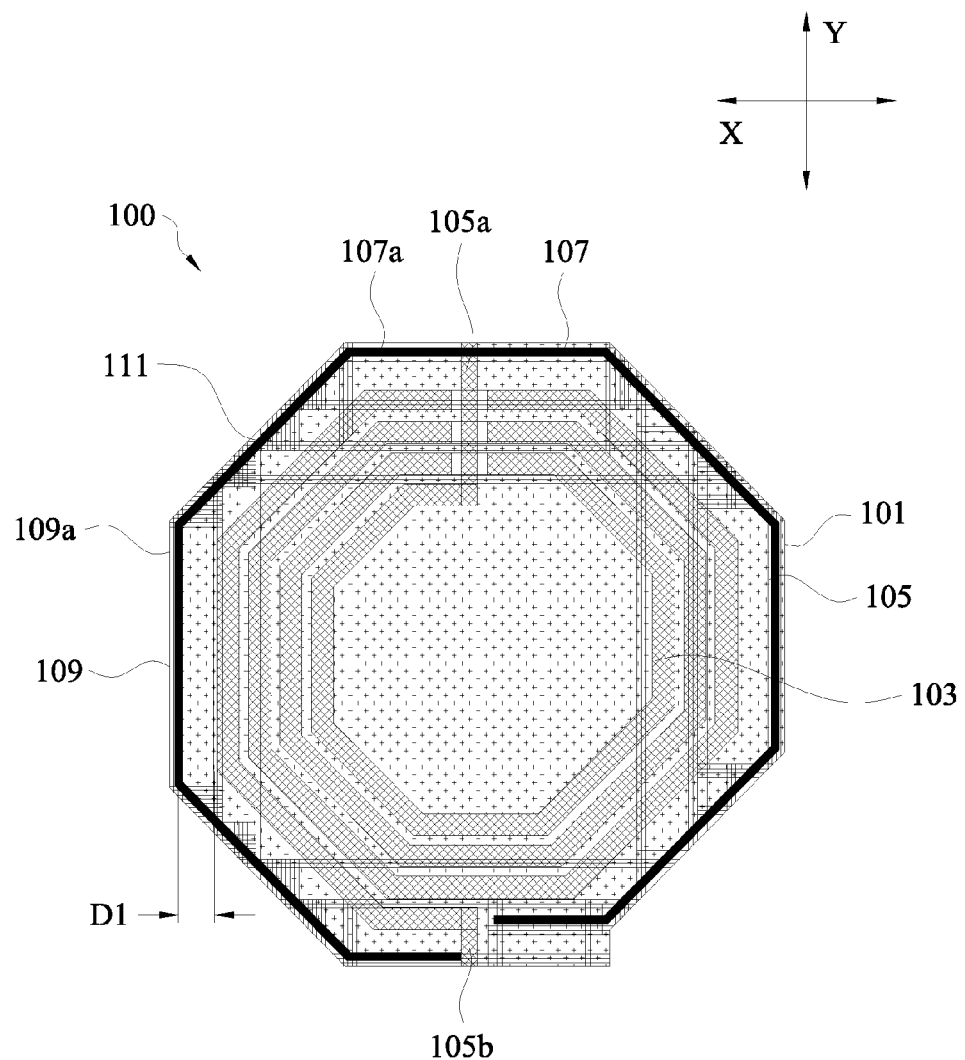
FIG. 1 is a diagram of an integrated circuit with a 1D metal routed guard ring, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Rectangular-shaped guard rings waste space. For example, an integrated circuit that has a rectangular-shaped guard ring for isolating an octagonal-shaped inductor has unoccupied space between the guard ring and the inductor, which results in larger integrated circuit chips than are necessary to perform a given function. This wasted space is compounded and becomes further evident if more than one inductor/guard ring combination is arranged on a same chip. Some integrated circuits are designed based on one-direction (1D) or two-direction (2D) design rules. A 1D design rule describes an integrated circuit feature such as a metal line or layer that is allowed to be routed along a single directional path, for example, in an X or a Y direction. A 2D design rule describes an integrated circuit feature such as a metal line or layer that is allowed to be routed along a directional path that advances in both the X and the Y direction to form a slanted line, for example.

FIG. 1 is a diagram of an integrated circuit 100 with a 1D metal routed guard ring 101, in accordance with one or more embodiments.

Integrated circuit 100 comprises the guard ring 101 over a substrate 103, and an inductor 105 over the substrate 103. The guard ring 101 comprises first metal lines 107a of a first metal layer 107 and second metal lines 109a of a second metal layer 109. The first metal lines 107a are coupled with the second metal lines 109a. One or more of the first metal lines 107a and one or more of the second metal lines 109a are arranged to form at least one staggered line 111 (also referred to as a zigzag or stair step line) that makes up a portion of the guard ring 101. Substrate 103 comprises one or more of silicon, glass, a polymer, an oxide, or other suitable material or combination of suitable materials.

An inductor, e.g., inductor 105, is a passive device which is used to store energy in a magnetic field. Inductors have a measurable inductance (L), which is a measure of the magnetic field generated from a conductor. Inductance varies according to the inductor characteristics such as a number of loops, loop sizes, wire diameter, and other suitable characteristics. In some embodiments, the inductor 105 is a spiral inductor that is a circular, polygonal, or other shaped inductor that is routed in a spiral formation. In some embodiments, the inductor 105 is octagonal-shaped. In some embodiments, the inductor 105 is circular-shaped. In some embodiments, the inductor 105 is triangular-shaped, hexagonal-shaped, trapezoidal-shaped, or other suitable shape. The inductor 105 comprises a conductive material such as a metal, a metal composite, or other suitable material that is formed in one or more metallization layers by one or more of a physical vapor deposition process, a chemical vapor deposition process, a plating process, or other suitable process.

The inductor 105 comprises inductor contacts 105a and 105b. The guard ring 101 surrounds the inductor 105 and makes it possible for the inductor contacts 105a and 105b to be coupled to one or more connections that are outside of the guard ring 101. For example, the guard ring 101 is configured to have one or more openings or partitions through which the inductor contacts 105a/b are coupled to a connection outside of the guard ring 101. The inductor contacts 105a/b are configured to extend above or below the guard ring 101 to facilitate coupling the inductor contacts 105a and 105b to the one or more connections that are outside of the guard ring 101.

In some embodiments, the first metal layer 107 is over the second metal layer 109. In other embodiments, the second metal layer 109 is over the first metal layer 107. The first metal layer 107 and the second metal layer 109 comprise a same or a different material or combination of materials. In some embodiments, the first metal layer 107 and/or the second metal layer 109 comprise a conductive material such as a metal, a metal composite, or other suitable material that is formed by one or more of a physical vapor deposition process, a chemical vapor deposition process, a plating process, or other suitable process.

The first metal lines 107a extend in a first direction X. The second metal lines 109a extend in a second direction Y. The first direction X is perpendicular to the second direction Y.

Two or more of the first metal lines 107a are offset from one another in one or more of the first direction X or the second direction Y. Two or more of the second metal lines 109a are offset from one another in one or more of the first direction X or the second direction Y. The offset first metal lines 107a and the offset second metal lines 109b are together configured to form the at least one staggered line 111. In some embodiments, at least one of the first metal lines 107a included in the at least one staggered line 111 has a first length. In some embodiments, two or more first metal lines 107a included in the at least one staggered line 111 are of the first length. In some embodiments, at least one of the first metal lines 107a included in the at least one staggered line 111 has a length different from the first length. In some embodiments, the first metal lines 107a included in the staggered line 111 have different lengths.

In some embodiments, the at least one of the second metal lines 109a included in the at least one staggered line 111 has a second length. In some embodiments, two of more second metal lines 109a included in the staggered line 111 are of the second length. In some embodiments, at least one of the second metal lines 109a included in the at least one staggered line 111 has a length different from the second length. In some embodiments, the second metal lines 109a included in the staggered line 111 have different lengths. In some embodiments, the first length is equal to the second length. In other embodiments, the first length is different from the second length.

In some embodiments, one or more of the first metal lines 107a and one or more of the second metal lines 109a included in the at least one staggered line 111 overlap.

The arrangement and configuration of the first metal lines 107a and the second metal lines 109a included in the at least one staggered line 111 form a guard ring 101 having the same shape as the inductor 105 while being in conformance with a 1D design rule. For example, a combination of first metal lines 107a and second metal lines 109a, are capable of being arranged to form a guard ring 101 that is octagonal, circular, trapezoidal, elliptical, triangular, parallelogram, hexagonal, pentagonal, or other shape such as another polygonal shape, a random shape having a staggered line that is primarily curved alone or in combination with a straight or a staggered line, or other suitable shape. In at least some embodiments, the arrangement and configuration of first metal lines 107a and the second metal lines 109a included in the at least one staggered line 111 form a guard ring 101 that is a different shape from the inductor 105 while being in conformance with a 1D design rule.

To form an octagonal guard ring 101, for example, the guard ring 101 includes four staggered lines 111, two first metal lines 107a that are continuous and have a length greater than the first metal lines 107a that are included in the four staggered lines 111, and two second metal lines 109a that are continuous and have a length greater than the second metal lines 109a included in the four staggered lines 111. In some embodiments, a continuous metal line optionally comprises a series of metal line segments that together form a continuous metal line that has a length greater than one of the metal lines included in the staggered lines 111, for example.

To form a guard ring 101 that is a right triangle, for example, the guard ring 101 optionally includes one staggered line 111, one first metal line 107a that has a length greater than the first metal lines 107a included in the staggered line 111, and one second metal line 109a that has a length greater than the second metal lines 109a included in the staggered line 111. To form a guard ring 101 that is a triangle other than a right triangle, the guard ring 101 includes two staggered lines 111, and one of one first metal line 107a that has a length greater than the first metal lines 107a included in the two staggered lines 111, or one second metal line 109a that has a length greater than the second metal lines 109a included in the two staggered lines 111.

In some embodiments, the arrangement and configuration of the first metal lines 107a and the second metal lines 109a included in the at least one staggered line 111 and/or otherwise included as a part of the guard ring 101 are arranged to be within a predetermined distance D1 from the inductor 105. In some embodiments, the predetermined distance D1 is uniform around the inductor 105.

The first metal lines 107a first ends and second ends. The second metal lines 109a comprise first ends and second ends. In some embodiments, the first metal lines 107a and the second metal lines 109a overlap at the first ends and the second ends of the first metal lines 107a and the second lines 109a. In some embodiments, other portions of the first metal lines 107a and the second metal lines 109a overlap. In some embodiments, the first metal lines 107a and the second metal lines 109a do not overlap.

Figure 2:
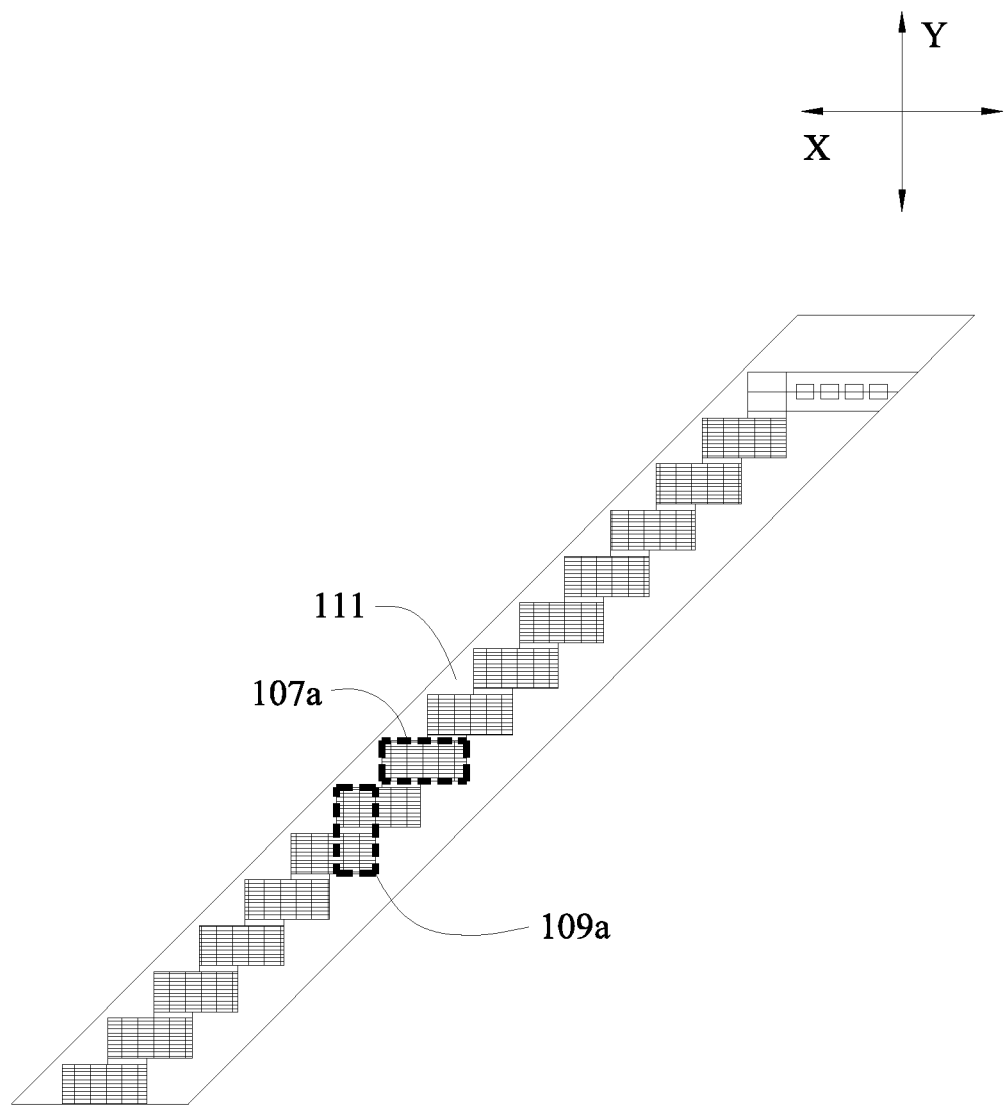
FIG. 2 is a diagram of a staggered line, in accordance with one or more embodiments.

FIG. 2 is a diagram of a staggered line 111, in accordance with one or more embodiments. Staggered line 111 comprises first metal lines 107a and second metal lines 109a. The first metal lines 107a extend in the first direction X and the second metal lines 109a extend in the second direction Y. The first metal lines 107a and the second metal lines 109a are coupled. A guard ring 101 (FIG. 1) that includes one or more staggered lines 111 has performance properties within an allowable process tolerance compared to a guard ring that is formed in compliance with a conventional 2D metal routing rule.

For example, the resistive and capacitive components of the inductor 105 (FIG. 1) may adversely affect a Q-factor (Quality) and FSR (Self-Resonant Frequency) of the inductor. The Q-factor is a measure of the inductor efficiency and is a ratio of the inductance to resistance at a given frequency. A higher Q-factor value indicates a lower rate of energy loss. The FSR of an inductor is the natural frequency in which the inductor oscillates freely. The integrated circuit 100, which is formed in compliance with a 1D design rule, achieves L and Q-factor values that are within a predefined allowable process tolerance compared to an integrated circuit that included a guard ring formed in compliance with a 2D design rule. A 1D design rule compliant integrated circuit having a square or rectangular guard ring that is formed to have the same or similar L and Q-factor values is larger than a 2D design rule compliant integrated circuit. But, unlike conventional 1D design rule compliant integrated circuits that have rectangular or square guard rings, the one or more staggered lines 111 form a guard ring 101 that is the same or similar shape as the inductor 105, such as a guard ring 101 that is octagonal, which reduces the space occupied by the integrated circuit 100 compared to a conventional 1D design rule compliant integrated circuit. For example, in some embodiments, the integrated circuit 100 occupies a space that is 8-12% less than a space occupied by a conventional 1D design rule compliant integrated circuit that has the same or similar L and Q-factor values.

Figure 3:
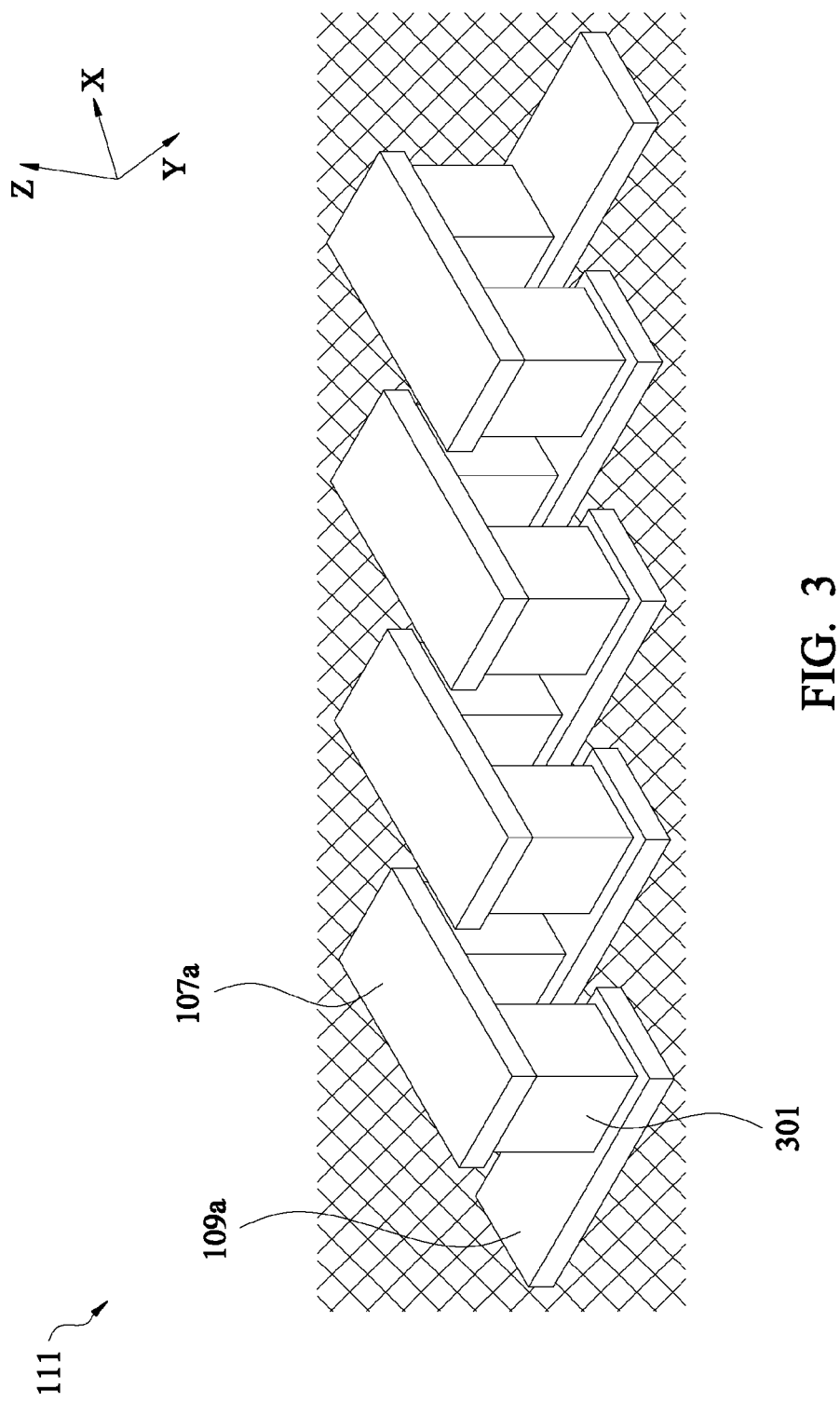
FIG. 3 is a perspective view of a staggered line, in accordance with one or more embodiments.

FIG. 3 is a perspective view diagram of a staggered line 111, in accordance with one or more embodiments. Staggered line 111 comprises first metal lines 107a and second metal lines 109b. The first metal lines 107a extend in the first direction X and the second metal lines 109a extend in the second direction Y. The first metal lines 107a and the second metal lines 109a are coupled by way of vias 301 that extend along a third direction Z. The third direction Z is perpendicular to the first direction X and the second direction Y.

In some embodiments, the vias 301 comprise a conductive material such as a metal, a metal composite, or other suitable material that is formed in one or more metallization layers, through one or more layers, or between one or more layers such as dielectric layers, insulation layers, metallization layers, or other type of layer by one or more of a physical vapor deposition process, a chemical vapor deposition process, a plating process, or other suitable process.

Figure 4:
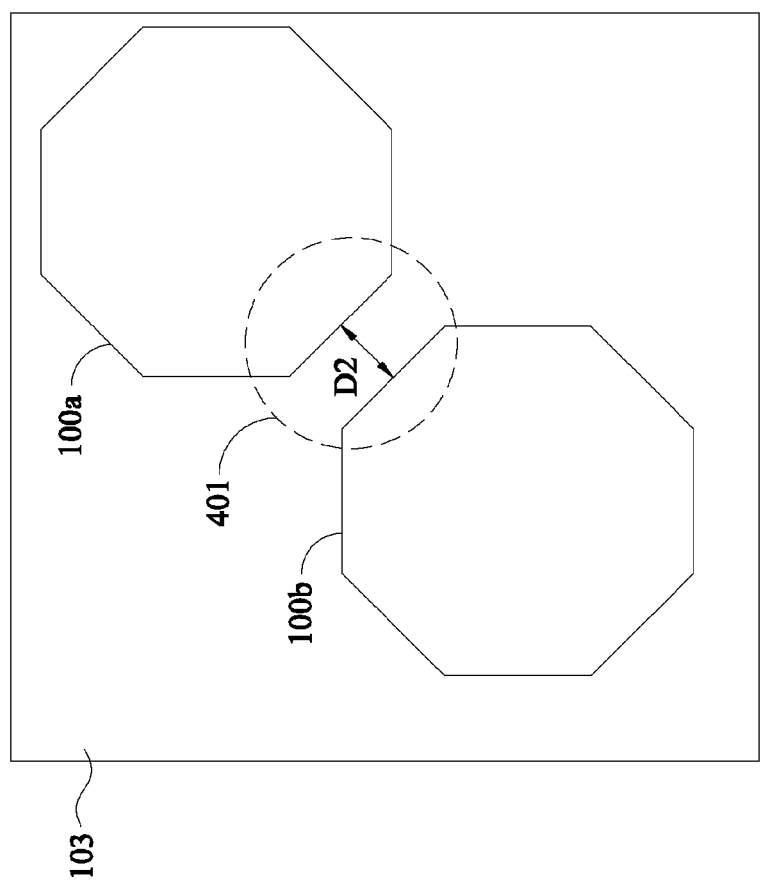
FIG. 4 is a diagram of two integrated circuits in close proximity, in accordance with one or more embodiments.

FIG. 4 is a diagram of a first integrated circuit 100a in close proximity to a second integrated circuit 100b over substrate 103, in accordance with one or more embodiments.

Because the guard rings 101 (FIG. 1) of the first integrated circuit 100a and the second integrated circuit 100b are of the same shape as the inductor 105 (FIG. 1), a space between the inductor 105 and the guard ring 101 is minimized. Additionally, the inductors 105 of the first integrated circuit 100a and the second integrated circuit 100b are capable of being placed closer to one another. In at least some embodiments, the inductors 105 of the first integrated circuit 100a and the second integrated circuit 100b are capable of being placed as close to one another as possible. In some embodiments, a guard ring 101 of the first integrated circuit 100a and a guard ring 101 of the second integrated circuit 100b are arranged on the substrate 103 such that a portion of the respective guard rings 101 are separated by a distance D2 that is from 0 micrometers to about 10 micrometers. Accordingly, the guard rings 101 of the first integrated circuit 100a and the second integrated circuit 100b reduce an area occupied by the first integrated circuit 100a and the second integrated circuit 100b on the substrate 103. In some embodiments, the first integrated circuit 100a and the second integrated circuit 100b have guard rings 101 that share a sidewall, thereby making it possible to further reduce the amount of space occupied by the first integrated circuit 100a and the second integrated circuit 100b on the substrate 103. For example, the sidewalls of the guard rings 101 of the first integrated circuit 100a and the second integrated circuit 100b that are adjacent to one another inside of imaginary circle 401 are capable of being formed as a single sidewall that is sharable between the first integrated circuit 100a and the second integrated circuit 100b.

In some embodiments, more than two integrated circuits 100 are placed near one another over substrate 103. In some embodiments, the overall shape of the integrated circuits 100 that are placed near one another over substrate 103 are the same shape. In other embodiments, the overall shape of at least one of the integrated circuits 100 that are placed near one another over the substrate 103 are different shapes such that a space occupied by the integrated circuits 100 on the substrate 103 is minimized.

Figure 5:
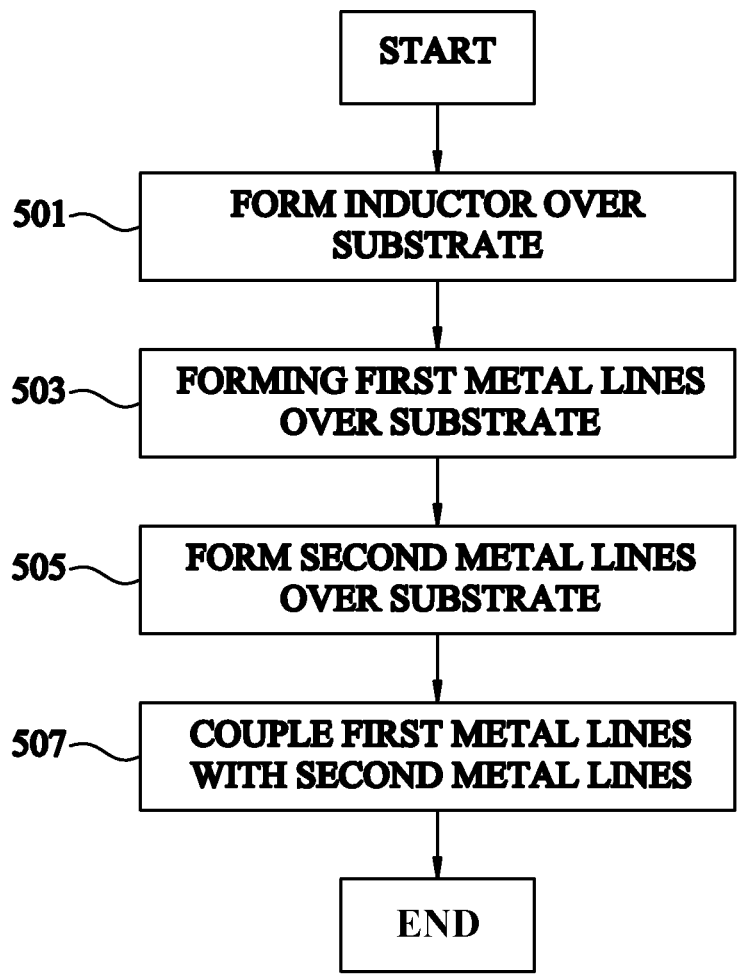
FIG. 5 is a flowchart of a method of forming an integrated circuit, in accordance with one or more embodiments.

FIG. 5 is a flowchart of a method 500 of forming an integrated circuit, in accordance with one or more embodiments. The method 500 is implemented to one or more of manufacture or design an integrated circuit such as integrated circuit 100 (FIG. 1). If method 500 is performed to design an integrated circuit, the method 500 is implemented by a processor configured to execute a set of computer-readable instructions that interface with a circuit design system to design and render a layout of an integrated circuit having the features discussed herein. In step 501, an inductor such as inductor 105 (FIG. 1) is formed over a substrate such as substrate 103 (FIG. 1). In step 503, first metal lines such as first metal lines 107a (FIG. 1) that extend in a first direction are formed over the substrate. In step 505, second metal lines such as second metal lines 109a (FIG. 1) that extend in a second direction different from the first direction are formed over the substrate. In step 507, the first metal lines are coupled with the second metal lines. In some embodiments, the first metal lines are directly coupled with the second metal lines. In other embodiments, vias such as vias 301 (FIG. 3) are formed coupling the first metal lines to the second metal lines. The first metal lines, the second metal lines, the second metal lines, and the optional vias together form a guard ring such as guard ring 101 (FIG. 1) that at least substantially surrounds the inductor.

Figure 6:
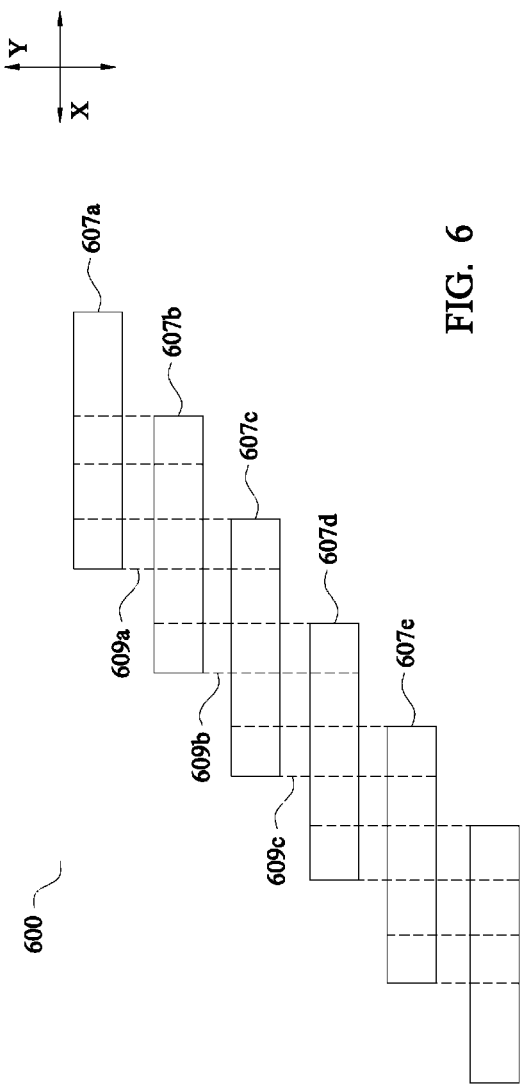
FIG. 6 is a plan view of a staggered line, in accordance with one or more embodiments.
Figure 7:
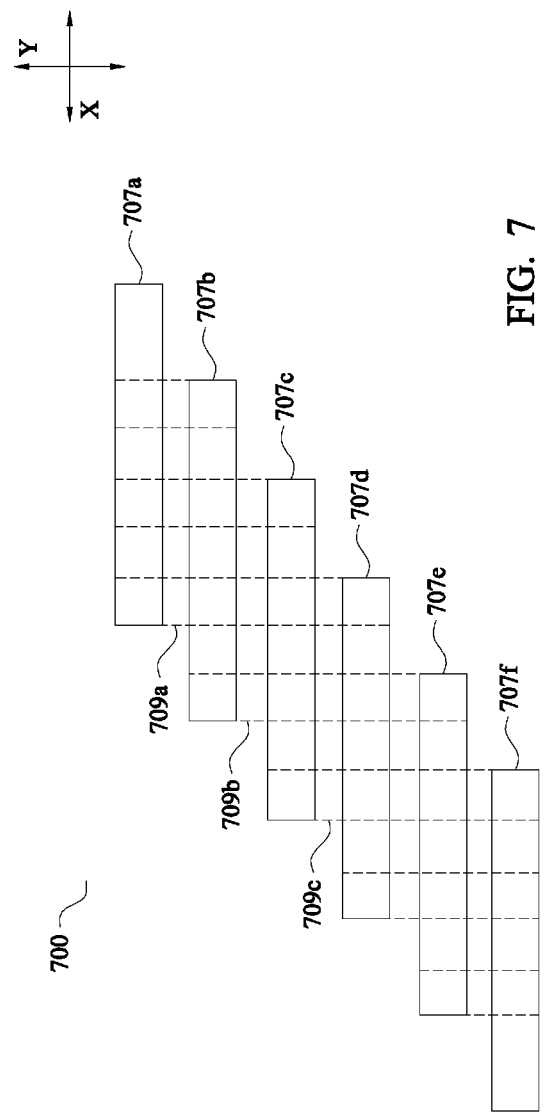
FIG. 7 is a plan view of a staggered line, in accordance with one or more embodiments.

FIGS. 6-7 are plan views of various staggered lines in accordance with one or more embodiments. Each of the various staggered lines has a different layout structure for the staggered line 111 in FIG. 1. In some embodiments, the various staggered lines are used in the guard ring 101 in FIG. 1 for embodiments of the inductor 105 in FIG. 1 that are operated at a frequency over 30 GHz.

FIG. 6 is a plan view of a staggered line 600 in accordance with some embodiments. The staggered line 600 comprises a plurality of first metal lines 607a-e (collectively referred to as first metal lines 607) of the first metal layer 107 and a plurality of second metal lines 609a-c (collectively referred to as second metal lines 609) of the second metal layer 109. In some embodiments, the first and second metal layers 107, 109 may be layers in a graphic database system (GDS) file, such as PO (polysilicon), OD (oxide-dimensioned region), via, metal etc. For illustration purposes, the terms "metal layer" and "GDS layer" are used interchangeably in this disclosure and such use should not limit the scope of claims appended herewith.

The first metal lines 607 of the plurality of first metal lines 607 extend in the first direction X and the second metal lines 609 of the plurality of second metal lines 609 extend in the second direction Y. For simplicity, only five first metal lines 607 and three second metal lines 609 are labeled. For illustration purposes, reference numbers for the five discussed first metal lines 607 are first metal lines 607a-607e and reference numbers for the three discussed second metal lines 609 are second metal lines 609a-609c.

The second metal line 609a is connected to the first metal lines 607a and 607c by direct contacts or vias (not shown). In some embodiments, the second metal line 609a crosses over or below the first metal line 607b without any coupling. In some embodiments, the second metal line 609a is connected to the first metal line 607b by direct contact or via (not shown). Similarly, the second metal line 609b is connected to the first metal lines 607b and 607d by direct contacts or vias (not shown). In some embodiments, the second metal line 609b crosses over or below the first metal line 607c without any coupling. In some embodiments, the second metal line 609b is connected to the first metal line 607c by direct contact or via (not shown). Furthermore, the second metal line 609c is connected to the first metal lines 607c and 607e by direct contacts or vias (not shown). In some embodiments, the second metal line 609c crosses over or below the first metal line 607d without any coupling. In some embodiments, the second metal line 609c is connected to the first metal line 607d by direct contact or via (not shown).

In some embodiments, the first metal lines 607 and the second metal lines 609 form zigzag lines. For example, the first metal line 607c and the second metal lines 609a, 609c form a first zigzag line. The first metal lines 607b, 607d and the second metal line 609b form a second zigzag line. In some embodiments, the first zigzag line and the second zigzag line form a diagonal twisted guard ring.

In some embodiments, the first metal lines 607 and the second metal lines 609 in the corresponding zigzag lines form quadrangles. For example, the first metal line 607c and the second metal line 609a in the first zigzag line and the first metal line 607b and the second metal line 609b in the second zigzag line form a first quadrangle. In some embodiments, the first metal line 607c and the second metal line 609c in the first zigzag line and the first metal line 607d and the second metal line 609b in the second zigzag line form a second quadrangle.

In some embodiments, the first zigzag line and the second zigzag line form interconnection crosses in at least two GDS layers. For example, the first metal line 607b of the second zigzag line in the first GDS layer and the second metal line 609a of the first zigzag line in the second GDS layer form an interconnection cross. For another example, the first metal line 607c of the first zigzag line in the first GDS layer and the second metal line 609b of the second zigzag line in the second GDS layer form an interconnection cross. For further example, the first metal line 607d of the second zigzag line in the first GDS layer and the second metal line 609c of the first zigzag line in the second GDS layer form an interconnection cross. In some embodiments, the first zigzag line and the second zigzag line form at least three interconnection crosses.

In some embodiments, at least two first metal lines in the staggered line 600 have different lengths. In some embodiments, at least two second metal lines in the staggered line 600 have different lengths. In some embodiments, all of the first metal lines in the staggered line 600 have equal first lengths. In some embodiments, all of the second metal lines in the staggered line 600 have equal second lengths. In some embodiments, the first length is equal to the second length. In some embodiments, the first length is different from the second length.

FIG. 7 is a plan view of a staggered line 700 in accordance with some embodiments. The staggered line 700 comprises a plurality of first metal lines 707a-707f (collectively referred to as first metal line(s) 707) of the first GDS layer. The staggered line 700 further comprises a plurality of second metal lines 709a-c (collectively referred to as second metal lines 709) of the second GDS layer. The plurality of first metal lines 707 extend in the first direction X and the plurality of second metal lines 709 extend in the second direction Y. For simplicity, only three second metal lines are labeled. For illustration purposes, reference numbers for the three discussed second metal lines 609 are second metal lines 609a-609c.

The second metal line 709a is connected to the first metal lines 707a and 707d by direct contacts or vias (not shown). In some embodiments, the second metal line 709a crosses over or below the first metal lines 707b, 707c without any coupling. In some embodiments, the second metal line 709a is connected to the first metal lines 707b, 707c by direct contacts or vias (not shown). Similarly, the second metal line 709b is connected to the first metal lines 707b and 707e by direct contacts or vias (not shown). In some embodiments, the second metal line 709b crosses over or below the first metal lines 707c, 707d without any coupling. In some embodiments, the second metal line 709b is connected to the first metal line 707c, 707d by direct contacts or vias (not shown). Furthermore, the second metal line 709c is connected to the first metal lines 707c and 707f by direct contacts or vias (not shown). In some embodiments, the second metal line 709c crosses over or below the first metal lines 707d, 707e without any coupling. In some embodiments, the second metal line 709c is connected to the first metal lines 707d, 707e by direct contacts or vias (not shown).

In some embodiments, the first metal lines 707 and the second metal lines 709 form zigzag lines. For example, the first metal lines 707a, 707d and the second metal line 709a form a first zigzag line. The first metal lines 707b, 707e and the second metal line 709b form a second zigzag line. The first metal lines 707c, 707f and the second metal line 709c form a third zigzag line. In some embodiments, the first zigzag line, the second zigzag line and the third zigzag line form a diagonal twisted guard ring.

In some embodiments, the first metal lines 707 and the second metal lines 709 in the corresponding zigzag lines form quadrangles. For example, the first metal line 707d and the second metal line 709a in the first zigzag line and the first metal line 707b and the second metal line 709b in the second zigzag line form a first quadrangle. For another example, the first metal line 707e and the second metal line 709b in the second zigzag line and the first metal line 707c and the second metal line 709c in the third zigzag line form a second quadrangle.

In some embodiments, the first zigzag line, the second zigzag line and the third zigzag line form interconnection crosses in at least two GDS layers. For example, the first metal line 707b of the second zigzag line in the first GDS layer and the second metal line 709a of the first zigzag line in the second GDS layer form an interconnection cross. The first metal line 707d of the first zigzag line in the first GDS layer and the second metal line 709b of the second zigzag line in the second GDS layer form another interconnection cross.

For another example, the first metal line 707c of the third zigzag line in the first GDS layer and the second metal line 709b of the second zigzag line in the second GDS layer form an interconnection cross. The first metal line 707e of the second zigzag line in the first GDS layer and the second metal line 709c of the third zigzag line in the second GDS layer form another interconnection cross.

For further example, the first metal line 707c of the third zigzag line in the first GDS layer and the second metal line 709a of the first zigzag line in the second GDS layer form an interconnection cross. The first metal line 707d of the first zigzag line in the first GDS layer and the second metal line 709c of the third zigzag line in the second GDS layer form another interconnection cross.

In some embodiments, at least two first metal lines in the staggered line 700 have different length. In some embodiments, at least two second metal lines in the staggered line 700 have different lengths. In some embodiments, all of the first metal lines in the staggered line 700 have equal first lengths. In some embodiments, all of the second metal lines in the staggered line 700 have equal second lengths. In some embodiments, the first length is equal to the second length. In some embodiments, the first length is different from the second length.

In some embodiments, at least two of the staggered lines shown in FIG. 2-3, 6-7 are formed diagonally such that the at least two of the staggered lines are in parallel with each other.

In some embodiments, an integrated circuit includes a circuit and a guard ring. The circuit is over a substrate. The guard ring surrounds the circuit and includes a staggered line. The staggered line comprises a first zigzag line and a second zigzag line. The first zigzag line comprises interconnections formed in at least two GDS layers. The second zigzag line comprises interconnections formed in at least two GDS layers. The first zigzag line and the second zigzag line form a first quadrangle and a second quadrangle.

In some embodiments, a guard ring includes a staggered line. The staggered line comprises a plurality of zigzag lines. At least one of the pluralities of zigzag lines comprises interconnections formed in at least two different directions. At least one of the pluralities of zigzag lines comprises interconnections formed in at least two GDS layers. The pluralities of zigzag lines form a plurality of quadrangles.

In some embodiments, an integrated circuit comprises a circuit and a guard ring. The circuit is over a substrate. The guard ring surrounds the circuit and includes a staggered line. The staggered line comprises three zigzag lines. At least one of the three zigzag lines comprises interconnections formed in two different directions. At least one of the three zigzag lines comprises interconnections formed in at least two GDS layers. The three zigzag lines form at least two quadrangles and at least six interconnection crosses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a circuit over a substrate; and
    a guard ring surrounding the circuit and including a staggered line;
    wherein
        the staggered line comprises a first zigzag line and a second zigzag line;
        the first zigzag line comprises interconnections formed in at least two graphic database system (GDS) layers;
        the second zigzag line comprises interconnections formed in at least two GDS layers; and
        the first zigzag line and the second zigzag line form a first quadrangle and a second quadrangle.

2. The integrated circuit of claim 1, wherein at least one interconnection of the first zigzag line extends in a first direction, and at least two interconnections of the first zigzag line extend in a second direction different from the first direction.

3. The integrated circuit of claim 1, wherein at least two interconnections of the second zigzag line extends in a first direction, and at least one interconnection of the second zigzag line extend in a second direction different from the first direction.

4. The integrated circuit of claim 1, wherein interconnections of the staggered line in a first direction have equal first lengths.

5. The integrated circuit of claim 4, wherein interconnections of the staggered line in a second direction have equal second lengths.

6. The integrated circuit of claim 5, wherein the first length is equal to the second length.

7. The integrated circuit of claim 5, wherein the first length is different from the second length.

8. The integrated circuit of claim 1, wherein at least two interconnections of the staggered line in a first direction have different lengths.

9. The integrated circuit of claim 1, wherein at least two interconnections of the staggered line in a second direction have different lengths.

10. The integrated circuit of claim 1, wherein the first zigzag line and the second zigzag line form interconnection crosses in at least two GDS layers.

11. A guard ring comprising:
    a staggered line comprising a plurality of zigzag lines;
    wherein
        at least one zigzag line of the plurality of zigzag lines comprises interconnections formed in at least two different directions, a first direction and a second direction;
        at least one of zigzag line of the plurality of zigzag lines comprises interconnections formed in at least two graphic database system (GDS) layers; and
        the zigzag lines of the plurality of zigzag lines form a plurality of quadrangles.

12. The guard ring of claim 11, wherein the zigzag lines of the plurality of zigzag lines form a plurality interconnection crosses in at least two GDS layers.

13. The guard ring of claim 11, wherein at least two interconnections of the staggered line in the first direction have different lengths.

14. The guard ring of claim 11, wherein at least two interconnections of the staggered line in the second direction have different lengths.

15. The guard ring of claim 11, wherein interconnections of the staggered line in the first direction have equal first lengths.

16. The guard ring of claim 15, wherein interconnections of the staggered line in the second direction have equal second lengths.

17. The guard ring of claim 16, wherein the first length is equal to the second length.

18. The guard ring of claim 16, wherein the first length is different from the second length.

19. An integrated circuit comprising:
    a circuit over a substrate; and
    a guard ring surrounding the circuit and including a staggered line;
    wherein
        the staggered line comprises three zigzag lines;
        at least one zigzag line of the three zigzag lines comprises interconnections formed in two different directions;
        at least one zigzag line of the three zigzag lines comprises interconnections formed in at least two graphic database system (GDS) layers; and
        the three zigzag lines form at least two quadrangles and at least six interconnection crosses.

20. The integrated circuit of claim 19, wherein the interconnection crosses are formed in at least two GDS layers.

* * * * *